(12) United States Patent
Murin et al.

(10) Patent No.: US 7,149,111 B2
(45) Date of Patent: Dec. 12, 2006

(54) METHOD OF HANDLING LIMITATIONS ON THE ORDER OF WRITING TO A NON-VOLATILE MEMORY

(75) Inventors: Mark Murin, Kfar Saba (IL); Menahem Lasser, Kohav Yair (IL)

(73) Assignee: Msystems Ltd., Kfar Saba (IL)

( * ) Notice: Subject to any disclaimer, the term of this patent is extended or adjusted under 35 U.S.C. 154(b) by 0 days.

(21) Appl. No.: 11/142,489

(22) Filed: Jun. 2, 2005

(65) Prior Publication Data
US 2006/0133157 A1    Jun. 22, 2006

Related U.S. Application Data

(60) Provisional application No. 60/636,510, filed on Dec. 17, 2004.

(51) Int. Cl.
*G11C 11/34* (2006.01)
(52) U.S. Cl. ............................. 365/185.03; 365/185.28
(58) Field of Classification Search .......... 365/185.03, 365/185.28, 185.11, 185.33
See application file for complete search history.

(56) References Cited

U.S. PATENT DOCUMENTS

| | | | |
|---|---|---|---|
| 5,404,485 A | 4/1995 | Ban | |
| 5,930,167 A | 7/1999 | Lee | |
| 5,937,425 A | 8/1999 | Ban | |
| 6,148,354 A | 11/2000 | Ban | |
| 6,426,893 B1 * | 7/2002 | Conley et al. | 365/185.11 |
| 6,456,528 B1 | 9/2002 | Chen | |
| 6,502,139 B1 | 12/2002 | Birk | |
| 6,522,580 B1 | 2/2003 | Chen | |
| 6,657,891 B1 * | 12/2003 | Shibata et al. | 365/185.03 |
| 6,853,581 B1 * | 2/2005 | Hazama | 365/185.03 |
| 6,891,755 B1 * | 5/2005 | Silvagni et al. | 365/185.13 |
| 6,903,972 B1 | 6/2005 | Lasser | |
| 2005/0256838 A1 | 11/2005 | Lasser | |

* cited by examiner

*Primary Examiner*—Anh Phung
(74) *Attorney, Agent, or Firm*—Mark M. Friedman (57) ABSTRACT

Sectors of data are stored in a non-volatile memory by writing all the sectors in a first order and subsequently writing all the sectors in a different, second order that is determined prior to the second writing. Sectors are stored in a non-volatile memory by writing the sectors using a first set of write operations and again writing the sectors using a second set of write operations that write one or more of the sectors twice. The first set writes each sector only once and the second set writes the sectors from outside the memory. The first set writes in a mode that couples the cells of the memory less than the second set. The first set writes less reliably than the second set.

51 Claims, 2 Drawing Sheets

Fig 1

Fig 2

METHOD OF HANDLING LIMITATIONS ON THE ORDER OF WRITING TO A NON-VOLATILE MEMORY

This patent application claims the benefit of U.S. Provisional Patent Application No. 60/636,510, filed Dec. 17, 2004

FIELD AND BACKGROUND OF THE INVENTION

The present invention relates to storage of data in a memory and, more particularly, to the order in which a stream of incoming data is stored in a non-volatile memory.

Examples of the storage of streams of data include the recording of digital audio (such as MP3 music files) in a cellular phone, the recording of digital video in a digital video camera, the recording of one or more digital still pictures in a digital still camera, and the copying of files from a personal computer into a portable USB flash drive. In all such cases the system contains a non-volatile memory module (that may be a flash memory card, a USB flash drive, an embedded on-board flash memory chip or any other configuration supporting non-volatile storage) and a data source that provides the data to be stored as a sequence of fixed-size sectors (in this application the term "sector" denotes a fixed-size chunk of data that is used as a basic unit of data exchange between the data source and the memory module). The data source may be the CPU controlling the camera or the cellular phone, the CPU of a host computer retrieving previously stored data from its hard disk and sending the data to the portable USB drive, the controller of a sensor collecting image data, or any other component capable of providing a stream of data.

There are cases in which the order of arrival of the data sectors from the data source to the memory module is not the best order for writing the sectors into the memory module.

A first example in which this may be the case is that of storing the data in a way that optimizes the speed of later reading them out. Considerations regarding optimizing reading performance by methods of allocating space inside a memory device are found in Lasser, U.S. patent application Ser. No. 10/952,837, filed on Sep. 30, 2004 and entitled "Method of Managing Files for Optimal Performance". This patent application is incorporated by reference for all purposes as if fully set forth herein. Such methods are very useful when the data are expected to be read out many times before being deleted or modified, as it is cost-effective to spend more time on re-arranging the data when writing them in return for faster reading that will pay back many times. Copying MP3 music files into a flash memory based MP3 player provides a good example of this: a song will most probably be played back many times before the user will delete it for making room for a new one. Similarly, there are cases in which the reading performance is much more important than the writing performance. For example, a memory module for a game console must launch the game application as fast as possible so as not to annoy the user waiting for the opening screen to appear, while the preloading of the game application into the module is done once at manufacturing time. Although the specific examples in U.S. Ser. No. 10/952,837 do not require storage in a diferent order from that in which the data are received, systems are known in which data are received in one order and presented to a user in a different order. For example, Birk et al., U.S. Pat. No. 6,502,139, teach a Near Video On Demand method in which the segments of a video stream are all transmitted simultaneously, with the segments subsequent to the first segment being broken into subsegments before transmission, and the later subsegments of a segment subsequent to the first segment may be received by a viewer before the earlier subsegments of the same segment. A viewer wishing to archive such a video transmission needs to re-order the segments and the subsegments in order to store them in their true order. To summarize this example: a sequence of sectors is provided by a data source to a memory module, such that each sector of data requires one writing operation in order to be stored, and it is desired that the order in which the sectors are stored in memory be different from the order in which the sectors are originally received. In some memory technologies it is possible to implement the required order permutation by writing each sector, upon its arrival, into its final target location. However, many memory technologies do not allow random order of writing. For example Multi-Level-Cell (MLC) NAND flash devices require the physical pages of a memory unit to be written strictly sequentially, and therefore the desired re-ordering of the sectors must be done after the whole group of permuted sectors targeted for the same memory unit is available, so that the writing can proceed sequentially in the physical space and still produce the desired storage order.

Other examples of the need to change the order of writing operations (as compared with the order of receiving the data sectors) are more complex, as they lack the simple one-to-one correspondence between a sector and a write operation. This complication may arise with storage technologies that require one or more of the sectors to be written more than once. See for example Chen et al. U.S. Pat. No. 6,522,580 entitled "Operating Techniques For Reducing Effects Of Coupling Between Storage Elements Of a Non-Volatile Memory Operated in Multiple Data States". This patent is incorporated by reference for all purposes as if fully set forth herein. U.S. Pat. No. 6,522,580 teaches a method for eliminating or reducing cross-coupling effects between flash memory cells that store two bits per cell. The method requires that some of the data sectors be written a second time after other sectors are written to neighboring cells. See for example claim 1 of U.S. Pat. No. 6,522,580 that recites writing "a first group of storage elements" a second time, and claim 3 that recites that such second writing is not adjacent in time to the first writing of those cells, but is done after the writing of a second group of the storage elements (i.e. after another sector is written to adjacent cells). When using flash memory cells containing higher numbers of bits per cell (for example 4 bits per cell) there are much tougher requirements for reducing cross coupling effects, and therefore the limitations on writing order and on repeating writing more than once become even more complex than in U.S. Ser. No. 622,580. To summarize this example: a sequence of sectors is provided by a data source to a memory module, where each sector of data may require either one or more than one writing operation, and where it is desired that the order of the writing operations (which are now higher in number than the number of data sectors provided by the source, as some sectors are written more than once) be different from the order in which the corresponding sectors were originally received.

The prior art solution for achieving the required re-ordering and/or repeating of the writing operations uses a buffering technique. The incoming data sectors are buffered in a local volatile memory of the controller of the memory module. Then, after all the sectors that comprise the group of sectors that have to be manipulated together are available to the controller in its local volatile memory, the required re-ordering is determined, and a sequence of write operations that obey the restrictions of the non-volatile storage technology is generated. After the sequence ends, the buffered sectors are no longer needed and can be deleted from the volatile memory to make room for new data sectors.

This solution suffers from the following limitations:

a. There is a need for more volatile memory in the controller of the memory module. Usually the controller is a low-performance processing device, as it is highly desirable to reduce its cost. The amount of extra volatile memory required for the above buffering can be quite significant compared to the amount of volatile memory required for other purposes. For example, a low-cost microcontroller may have only 16 Kbytes of internal RAM, while a requirement for buffering 32 sectors of 2 Kbytes each translates into 64 Kbytes of RAM, so in this case a significant increase in the amount of RAM would be required with a corresponding increase in the controller's cost.

b. While the incoming data sectors are buffered in the volatile memory, these sectors are under risk of loss in case of a power failure. Volatile memory, as its name implies, loses its contents when power is removed. So it may be the case that the data source, after sending out a certain number of data sectors, assumes that those sectors are already safely stored in the memory module and therefore can be deleted from the source, while in reality the sectors are still buffered in volatile memory waiting to be stored into nonvolatile memory. The end result might be that an unexpected power loss (e.g. the user shutting the device off) results in a permanent loss of data.

c. Buffering of the data in volatile memory followed by flushing the data into nonvolatile memory might have a negative impact on the system's performance. Because of the risk of data loss described above, the controller typically attempts to flush out the buffered data into safe nonvolatile storage as soon as this is allowable. For example, if the re-ordering requirements lead to the buffering of 32 data sectors (because this is the group of sectors within which re-ordering is to be done), then once 32 sectors are available in the buffer and the flushing of data into the nonvolatile memory can start, the controller writes all of the sectors into their target location. If the writing into the nonvolatile medium is slow, this holds up the memory module in a busy state for a relatively long time and might cause a problem to the data source that may need to provide new data during that time. For example, if the writing of a sector into nonvolatile memory takes one millisecond, then the flushing of a 32-sector buffer takes 32 milliseconds. A digital video camera generating an MPEG2 stream with an average rate of 500 Kbytes per second produces a new sector of 2 Kbytes every 4 milliseconds on average, and cannot accept a pause of 32 milliseconds in the memory's operation.

d. The above considerations all dealt with localized writing, in which the incoming data are all part of one logical sequence and are to be stored together. There are however cases in which the data source simultaneously generates data for two different logical sequences that are to be stored separately. For example, a digital still camera that supports voice narration over a picture may send one stream of picture image data intermixed with a second stream of audio data, such that the two streams are to be stored in different (even though logically linked) files. For the prior art solution to handle such case, the amount of volatile buffering memory must be increased. This is so because each of the streams of sectors must be re-ordered on its own, and therefore each requires its own separate buffer. This further increases the cost of the memory module.

There is thus a widely recognized need for, and it would be highly advantageous to have, a method of re-ordering or repeating writing operations to a memory module that would overcome the disadvantages of the presently known method as described above.

SUMMARY OF THE INVENTION

According to the present invention there is provided a method of storing a plurality of sectors of data, including the steps of: (a) providing a non-volatile memory; (b) writing all the sectors in the non-volatile memory in a first order; and (c) subsequent to the writing of all the sectors in the first order, writing all the sectors in the non-volatile memory in a second order, different from the first order, that is determined prior to the writing of the sectors in the second order.

According to the present invention there is provided a method of storing a plurality of sectors of data, including the steps of: (a) providing a non-volatile memory; (b) writing the sectors in the memory using a first set of at least one write operation, each sector being written only once by the first set; and (c) subsequent to beginning the writing of the sectors using the first set, writing the sectors in the memory from outside the non-volatile memory using a second set of at least one write operation, at least one of the sectors being written twice by the second set.

According to the present invention there is provided a method of storing a plurality of sectors of data, including the steps of: (a) providing a non-volatile memory that includes a plurality of cells; (b) writing the sectors in the non-volatile memory using a first set of at least one write operation; and (c) subsequent to beginning the writing of the sectors using the first set, writing the sectors in the non-volatile memory using a second set of at least one write operation, at least one of the sectors being written twice by the second set; wherein the writing by the first set uses a first writing mode and the writing by the second set uses a second writing mode, the first writing mode reducing coupling between the cells that are written thereby, relative to the coupling between the cells that are written by the second writing mode, by leaving unwritten cells between cells that are written.

According to the present invention there is provided a method of storing a plurality of sectors of data, including the steps of: (a) providing a non-volatile memory; (b) writing the sectors to the non-volatile memory using a first set of at least one write operation; and (c) subsequent to beginning the writing of the sectors using the first set, writing the sectors in the non-volatile memory using a second set of at least one write operation, at least one of the sectors being written twice by the second set; wherein the writing by the first set has a lower reliability than the writing by the second set.

According to the present invention there is provided a memory device for storing a plurality of sectors of data, including: (a) a non-volatile memory; and (b) a controller for: (i) writing the sectors in the non-volatile memory in a first order, and (ii) subsequent to the writing of the sectors in the first order, writing the sectors in the non-volatile memory in a second order, different from the first order, that is determined prior to the writing of the sectors in the second order.

According to the present invention there is provided a memory device for storing a plurality of sectors of data, including: (a) a non-volatile memory; and (b) a controller for: (i) writing the sectors in the non-volatile memory using a first set of at least one write operation, each sector being written only once by the first set, and (ii) subsequent to beginning the writing of the sectors using the first set, writing the sectors in the non-volatile memory using a second set of at least one write operation from outside the non-volatile memory, at least one of the sectors being written twice by the second set.

According to the present invention there is provided a memory device for storing a plurality of sectors of data, including: (a) a non-volatile memory that includes a plurality of cells; and (b) a controller for: (i) writing the sectors in the non-volatile memory using a first set of at least one write operation, and (ii) subsequent to beginning the writing of the sectors using the first set, writing the sectors in the non-volatile memory using a second set of at least one write operation, at least one of the sectors being written twice by the second set, wherein the writing by the first set uses a first writing mode and the writing by the second set uses a second writing mode, the first writing mode reducing coupling between the cells that are written thereby, relative to the coupling between the cells that are written by the second writing mode, by leaving unwritten cells between cells that are written.

According to the present invention there is provided a memory device for storing a plurality of sectors of data, including: (a) a non-volatile memory; and (b) a controller for: (i) writing the sectors in the non-volatile memory using a first set of at least one write operation, and (ii) subsequent to beginning the writing of the sectors using the first set, writing the sectors in the non-volatile memory using a second set of at least one write operation, at least one of the sectors being written twice by the second set, wherein the writing by the first set has a lower reliability than the writing by the second set.

According to the present invention there is provided a computer-readable storage medium having computer-readable code embedded on the computer-readable storage medium, the computer-readable code for storing a plurality of sectors of data, the computer-readable code including: (a) program code for writing the sectors in a non-volatile memory in a first order; and (b) program code for, subsequent to the writing of the sectors in the first order, writing the sectors in the non-volatile memory in a second order, different from the first order, that is determined prior to the writing of the sectors in the second order.

According to the present invention there is provided a computer-readable storage medium having computer-readable code embedded on the computer-readable storage medium, the computer-readable code for storing a plurality of sectors of data, the computer-readable code including: (a) program code for writing the sectors in a non-volatile memory using a first set of at least one write operation, each sector being written only once by the first set; and (b) program code for writing the sectors in the non-volatile memory from outside the non-volatile memory using a second set of at least one write operation, at least one of the sectors being written twice by the second set.

According to the present invention there is provided a computer-readable storage medium having computer-readable code embedded on the computer-readable storage medium, the computer-readable code for storing a plurality of sectors of data, the computer-readable code including: (a) program code for writing the sectors in a non-volatile memory using a first set of at least one write operation; and (b) program code for writing the sectors in the non-volatile memory using a second set of at least one write operation, at least one of the sectors being written twice by the second set; wherein the non-volatile memory includes a plurality of cells, wherein the writing by the first set uses a first writing mode and wherein the writing by the second set uses a second writing mode, the first writing mode reducing coupling between the cells that are written thereby, relative to the coupling between the cells that are written by the second writing mode, by leaving unwritten cells between cells that are written.

According to the present invention there is provided a computer-readable storage medium having computer-readable code embedded on the computer-readable storage medium, the computer-readable code for storing a plurality of sectors of data, the computer-readable code including: (a) program code for writing the sectors in a non-volatile memory using a first set of at least one write operation; and (b) program code for writing the sectors in the non-volatile memory using a second set of at least one write operation, at least one of the sectors being written twice by the second set; wherein the writing by the first set has a lower reliability than the writing by the second set.

The method of the present invention includes four basic methods for writing a plurality of sectors of a data file to a non-volatile memory.

According to the first basic method of the present invention, a plurality of sectors to be stored first are written to a non-volatile memory in a first order (e.g. the order in which the sectors are received). Subsequently, the sectors are written to the non-volatile memory in a different, second order, that is determined prior to writing the sectors in the second order. That the sectors are written in the first order and then written in the second order distinguishes the present invention from Birk et al. who sometimes, in support of a "rewind" capability, write (only) some of their subsegments in the order received and then rewrite those subsegments in the order in which they should be displayed. That the second order for writing the sectors is determined before the sectors are written in the second order distinguishes the present invention from the prior art of reclamation of blocks of a flash memory, in which a block containing segments that were received and written later may be (coincidentally) copied and erased before a block containing segments that were received and written earlier; and also distinguishes the present invention from the prior art of defragmentation of a hard disk that may (coincidentally) rewrite segments in an order different from that in which the segments were written originally.

Preferably, the first and second orders are temporal orders (referring to the times at which the various sectors are written) rather than spatial orders (referring to the spatial arrangement of the physical addresses in which the various sectors are written).

Preferably, the second order is determined in accordance with the data.

Preferably, the non-volatile memory is provided as part of a memory device that also includes one or more other memories. During the time that elapses between the writing of all the sectors in the non-volatile memory in the first order and the subsequent writing of all the sectors in the non-volatile memory in the second order, the only place in the memory device where the sectors are stored is the non-volatile memory, and not any of the other memories of the device. For example, during this time, none of the sectors are also stored in a RAM of a controller of the memory device.

Preferably, the writing in the second order is effected using a different writing mode than the writing in the first order. More preferably, the first writing mode has a different density, most preferably a lower density, than the second writing mode. For example, in some more preferred embodiments of the first method, the non-volatile memory includes a plurality of cells, and the first writing mode stores a different number of data bits, most preferably fewer data bits, per cell than the second writing mode. In other more preferred embodiments of the first method, the first writing mode reduces coupling between cells of the non-volatile memory, relative to the coupling between the cells of the non-volatile memory that are written by the second writing mode, by leaving unwritten cells between written cells. Most preferably, the unwritten cells include cells of pages of the non-volatile memory that are skipped by the writing mode of the first order. For example, some most preferred embodiments of the first method skip one page between pairs of written pages, and other most preferred embodiments of the first method skip three pages between pairs of written pages.

Alternatively, the first mode has a different, most preferably lower, reliability than the second mode. Preferably, the different reliability includes a different data retention time: the length of time after the writing in the first order during which the sectors so written can be read reliably is different than the length of time after the writing in the second order during which the sectors so written can be read reliably.

Preferably, the writing in the second order according to the first method of the present invention is effected by a single plurality of consecutive write operations. That write operations are "consecutive" means that no other operation may intervene between two of the write operations except for operations in support of the write operations. For example, a flash memory device may find it necessary, while executing a set of consecutive write operations, to reclaim some blocks of its memory. The associated read, write and erase operations for reclaiming the memory blocks would be in support of the consecutive write operations, and so would not be deemed as interrupting the consecutivity of the write operations. By contrast, a host of the flash memory device would be forbidden from reading the flash memory device during the execution of the consecutive write operations, because the associated read operations would not be in support of the consecutive write operations.

Alternatively, the writing in the second order according to the first method of the present invention is effected by a plurality of intermittent write operations. That write operations are "intermittent" means that the execution of one or more other operations is allowed to intervene between the executions of two of the write operations.

According to the second, third and fourth basic methods of the present invention, a plurality of sectors to be stored first are written to a non-volatile memory using a first set of one or more write operations. Subsequently, the sectors are written to the non-volatile memory, using a second set of one or more write operations, with at least one of the sectors being written at least twice. Note that the scope of the claim includes commencing the second set of write operations before the first set of write operations has finished, although this normally is not a preferred mode of the invention. In this context, a "write" operation, with respect to given data, is an operation that changes the state of the memory to a different state in which the memory is capable of presenting the data to another device, i.e., a state in which the other device can read the data from the memory. This is as opposed to a "read" operation, that does not change the state of the memory, and as opposed to an "erase" operation, that leaves the memory in a state in which the memory is not capable of presenting the data to another device. The initial state of the memory before a write operation may also be a state in which the memory is capable of presenting the same data to another device. For example, when U.S. Pat. No. 6,522,580 writes the even-numbered-bit-line cells of a page, then writes the odd-numbered-bit-line cells of the page, and then again writes the even-numbered-bit-line cells of the page, the even-numbered cells store the same data before and after their second writing.

According to the second basic method, each sector is written only once by the first set of one or more write operations, and the second set of one or more write operations writes the sectors from outside the non-volatile memory.

Preferably, the second set uses a different writing mode than the first set. More preferably, the writing mode of the first set has a different density, most preferably a lower density, than the writing mode of the second set. For example, is some more preferred embodiments of the second method, the non-volatile memory includes a plurality of cells, and the first writing mode stores a different number of data bits, most preferably fewer data bits, per cell than the second writing mode. Also more preferably, the first writing mode has a different reliability, most preferably a lower reliability, than the second writing mode.

Lee et al., in U.S. Pat. No. 5,930,167, also teaches a method of writing data to a non-volatile memory in which the data first are written at a low number of bits (typically one bit) per cell and subsequently are written at a higher number of bits (typically two bits) per cell. The second basic method of the present invention differs from an embodiment of the method of U.S. Pat. No. 5,930,167 that uses the method of U.S. Pat. No. 6,522,580 to write the higher number of bits per cell in that when the second basic method of the present invention writes a sector to the memory twice, using the second set of one or more write operations, the second basic method of the present invention writes the sector from outside the memory, for example from temporary storage in a RAM that is outside the memory. By contrast, U.S. Pat. No. 6,522,580 keeps the twice-written data inside the memory, either in the cells to which the data are being written or in a separate register that is part of the memory.

According to the third basic method, the non-volatile memory includes a plurality of cells, and the second set uses a different writing mode than the first set. The writing mode of the first set reduces inter-cell coupling, relative to the writing mode of the second set, by leaving unwritten cells between cells that are written.

Preferably, the unwritten cells include cells of pages that are skipped by the writing mode of the first set. For example, some preferred embodiments of the third method skip one page between pairs of written pages, and other preferred embodiments of the third method skip three pages between pairs of written pages.

According to the fourth basic method, the writing by the second set has a lower reliability than the writing by the second set.

Preferably, the lower reliability includes a lower data retention time.

Some preferred embodiments of the second, third and fourth methods of the present invention have aspects in common with preferred embodiments of the first method of the present invention. For example, in some preferred embodiments of the second, third and fourth methods, the non-volatile memory is provided as part of a memory device that also includes one or more other memories. During the time that elapses between the writing of the sectors in the non-volatile memory by the first set of one or more write operations and the subsequent writing of all the sectors in the non-volatile memory by the second set of one or more write operations, the only place in the memory device where the sectors are stored is the non-volatile memory, and not any of the other memories of the device. For example, during this time, none of the sectors are also stored in a RAM of a controller of the memory device. In this context, storing the sectors outside the memory, in support of the second method for the purpose of writing the sectors by the second set from outside the memory, is considered to be part of the writing by the second set.

Other examples of preferred embodiments of the second, third and fourth methods of the present invention that have aspects in common with preferred embodiments of the first method of the present invention include preferred embodiments in which the second set of one or more write operations includes a consecutive plurality of write operations and preferred embodiments in which the second set of write operations includes an intermittent plurality of write operations.

Some preferred embodiments of the first method of the present invention, in writing the sectors in the second order, write at least one of the sectors twice, as in U.S. Pat. No. 6,522,580, or as in the second, third and fourth embodiments of the present invention.

The scope of the present invention also includes memory devices for implementing the methods of the present invention and computer-readable storage media in which is embedded computer-readable code for implementing the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method and of a memory module that re-orders and rewrites incoming data sectors without suffering from the deficiencies of the prior art method described above.

The principles and operation of a memory module according to the present invention may be better understood with reference to the drawings and the accompanying description.

The current invention overcomes the deficiencies of the prior art method by avoiding the volatile memory buffering and instead writing the incoming data sectors into the nonvolatile memory twice: once when the data sectors arrive and a second time when re-ordering can be done and the data sectors can be written into their final target locations while satisfying any ordering and repeating limitations. In a way, this is like using the nonvolatile memory as a buffer for itself. Obviously, such solution has its price: writing the data twice takes more time and power than writing them once. Additionally, one or more read operations are also required for moving the data from their first location to their second location, and this, too, consumes time and power. However, there are cases in which the benefits of the present invention far outweigh those disadvantages. For example, if an application cannot accept even the slightest risk of data loss, the present invention would have to be chosen regardless of performance or power considerations.

One may wonder why the data should be written a second time. If the incoming sectors already have been stored in the nonvolatile memory, why not leave them where they are? The answer to this is obvious when the motivation for re-ordering the sectors is performance optimization, as is the case in U.S. Ser. No. 10/952,837 and U.S. Pat. No. 6,502,139. Here there is the option of leaving the data in their first location, but their reading performance will suffer.

However, the great advantage of the present invention is revealed when the limitations imposed by the nonvolatile storage media prevent us from carrying out the first writing operation using the optimal mode of writing. Consider as an example the case of U.S. Pat. No. 6,522,580. Here the storage medium dictates that some data sectors must be written more than once, and the additional writing operations must follow strict ordering rules. Ostensibly, the same rules should also be followed in the first writing, as otherwise reliability problems might occur. The solution is to carry out the first writing in a different way that will somehow avoid the limitations. U.S. Pat. No. 6,522,580 writes two sectors to the even-numbered cells of a page, then writes two other sectors to the odd-numbered cells of the page, and finally rewrites the first two sectors to the even-numbered cells. Because the double writing of the first two sectors is necessitated by the coupling effect between adjacent cells, this coupling effect may be avoided by skipping cells. For example, writing only into even-numbered cells and skipping odd-numbered cells reduces coupling effects and therefore allows ignoring of the regular limitations and writing of the incoming sectors as they arrive. As another example, writing only into cells whose number is evenly divided by four and skipping all other cells reduces coupling effects even further and allows ignoring the regular limitations with even less risk of error. Now we can easily understand why we would rather not leave the data where they were first written: the usage of physical storage space is not efficient in the first writing. Two or four times as many pages are used to store the data as under the optimal writing method. The utilization of the storage capacity is only half or quarter of what it would be using the optimal writing method, and it would be very inefficient to leave it that way. Therefore the data are written a second time, this time using the default optimal mode of the storage medium.

A similar way to avoid the limitations of the optimal mode of writing in the first writing operation is to write to all the cells of a page, but to skip pages, e.g. one page between pairs of pages that are written, or three pages between pairs of pages that are written. Again, two or four times as much area of the storag emedium is used to store the data as under the opitmal writing method, so the data are rewritten using the default optimal mode of the storage medium.

Another example of carrying out the first writing in a different way is to use single-bit-per-cell writing mode in a flash memory device capable of multiple-bit-per-cell operation. Flash memories capable of supporting both multiple-bit-per-cell and single-bit-per-cell operation on the same cells are well known in the art. See for example Chen, U.S. Pat. No. 6,456,528, entitled "Selective Operation of a Multi-State Non-Volatile Memory System in a Binary Mode". Typically, the limitations imposed on writing order result from the tighter accuracy specifications required for reliable multiple-bit-per-cell operation. When the same memory cells are used for storing just a single bit each, the limitations may be ignored because the tolerances for accuracy become much more relaxed. Therefore, single-bit-per-cell mode can be used for the first writing (while ignoring any ordering or repeating limitations) and multiple-bit-per-cell mode can be used for the second writing (obeying all limitations). The reason for not leaving the data in their first location is very similar to the previous case: single-bit-per-cell mode is less efficient than multiple-bit-per-cell mode in storage space utilization. This method can be extended beyond the single-bit-per-cell case. Any two values of bits-per-cell may be used, with a lower number of bits per cell being used for the first write operations and a higher number of bits per cell being used for the second write operations. Combinations that are useful in flash memories (without limiting the invention to only these combinations) include:

a. One bit per cell in the first write operations, two bits per cell in the second write operations.

b. One bit per cell in the first write operations, three bits per cell in the second write operations.

c. One bit per cell in the first write operations, four bits per cell in the second write operations.

d. Two bits per cell in the first write operations, four bits per cell in the second write operations.

Still another example of carrying out the first writing in a different way is to use a reduced reliability mode in a device capable of both high reliability and low reliability writing modes. The difference between the two modes may be in the length of time the data is guaranteed to be retained after writing (typically referred to as "data retention time"), or in any other aspects of reliability specifications such as guaranteed temperature range or guaranteed external power supply voltage range. Memories capable of supporting both high reliability and low reliability writing modes on the same cells are known in the art. See for example Lasser et al., U.S. patent application Ser. No. 10/735,667, filed on Dec. 16, 2003 and entitled "Method of Archiving Data". This patent application is incorporated by reference for all purposes as if fully set forth herein. In such memories it may be the case that by ignoring the ordering limitations we lose the ability to write with high reliability, but we still end up with a valid writing operation even if with lower reliability. Therefore we can ignore the ordering limitations for the first writing, and follow them for the second writing. In this case the reason for not leaving the data in its first location is not storage inefficiency but reliability. While it is acceptable to have the data kept in low reliability mode for a short time, it is totally unacceptable to leave them like that for long-term storage, and all data should be moved into high reliability mode as soon as this is possible.

The moving of the data from their first location to their second location can take place immediately when all sectors involved in the re-ordering of the current group of sectors are available. Using such a policy moves the full sequence of data sectors as one continuous set of consecutive write operations. However, as all incoming sectors are safely stored in nonvolatile memory immediately upon their arrival, there is no urgency in doing that movement. The controller of the memory module can delay the movement of data if that is more convenient, only having to make sure that, if a read request for that data is received from the host of the memory module before the data are moved to its final destination, it is still possible to locate the data and send the data to the host. More than that, there is also no need to move the full group of sectors together. The moving of the data can be broken into several sets of write operations, separated in time from each other. The smaller sets of write operations can move a single sector each, two sectors each, four sectors each, eight sectors each, or otherwise broken into smaller pieces in any convenient way, not even requiring all of them to be of the same number of sectors. This is very useful in overcoming the performance problem of the prior art solution, as is explained more fully below.

We can now see that all of the limitations of the prior art solution are addressed by the present invention:

a. There is no need to increase the amount of volatile memory in the controller beyond what is needed for the controller's regular operation. No extra volatile memory needs to be allocated to buffering. This is because between the first and second writing of the data sectors into the nonvolatile memory, no copy of the data need to be retained anywhere within the controller (except in the location into which it was written in the first write operation). The extra space temporarily used for the first writing in the nonvolatile memory is negligible in cost in comparison to the same amount of volatile storage space added into the controller.

b. There is no risk of data loss, even upon power failure. The incoming data are stored into nonvolatile memory as soon as they arrive.

c. Because the data are always safely stored (even before being moved to their final destination), there is no urgency in moving all sectors at once. Once all related sectors are available, the controller can start moving them in small chunks rather than all together. A typical implementation has the controller do only a single sector write on each step, and then service any new requests from the data source if any arrive. This way the data source never encounters a pause in service from the memory module beyond the length of a single sector write operation.

d. Multiple intermixed independent streams of incoming sectors can be easily serviced without further increasing the amount of volatile memory. Each stream is put into a different area of the nonvolatile memory, and moved to its final location when enough of its sectors are available. Again, the extra space temporarily used for the first writing of both streams into the nonvolatile memory is negligible in cost in comparison to achieving the same by increasing the amount of volatile memory in the controller.

Figure 1:
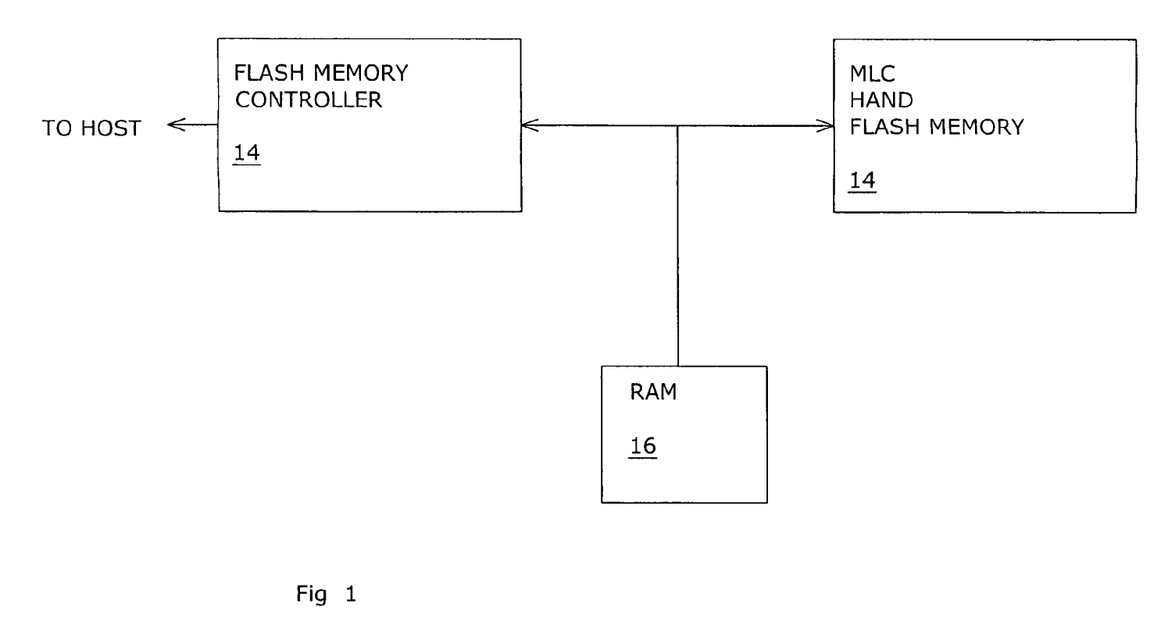
FIG. 1 is a high-level block diagram of a flash memory device of the present invention.

Referring now to the drawings, FIG. 1 is a high-level block diagram of a flash memory device 10 of the present invention. FIG. 1 is adapted from FIG. 1 of U.S. Pat. No. 5,404,485, to Ban, which patent is incorporated by reference for all purposes as if fully set forth herein. Device 10 includes an MLC NAND flash memory 12, a flash memory controller 14 and a RAM 16. Controller 14 manages flash memory 12 as taught in U.S. Pat. No. 5,404,485 and in U.S. Pat. No. 5,937,425, also to Ban, which patent also is incorporated by reference for all purposes as if fully set forth herein. (U.S. Pat. No. 5,404,485 applies to the management of flash memories generally. U.S. Pat. No. 5,937,425 is specific to NAND flash memories.) Controller 14 exchanges data stored in flash memory 12 with a host device (not shown) in the conventional manner. For example, if device 10 is used for non-volatile data storage in a system such as a personal computer, then controller 14 communicates with the other components of the system via the system's bus. If device 10 is a portable storage device that is reversibly attached to a host using a suitable interface, for example the USB interface taught in U.S. Pat. No. 6,148,354, to Ban et al., then controller 14 communicates with the host via that interface.

According to the prior art, controller 14, when needing to re-order or rewrite incoming data sectors, would use RAM 16 as a buffer. According to the present invention, controller 14 instead uses flash memory 12 as its own buffer. Controller 14 writes incoming data sectors to flash memory 12 in the order received and/or not necessarily in the optimal mode for flash memory 12. Later, at its leisure, controller 14 copies the data sectors within flash memory 12 in the desired order and/or according to the optimal writing mode of flash memory 12. Under the second method of the present invention, as part of the second set of write operations, controller 14 reads data sectors that are to be rewritten in flash memory 12 from flash memory 12, stores these sectors temporarily in RAM 16 and writes the sectors twice from RAM 16 to flash memory 12.

Figure 2:
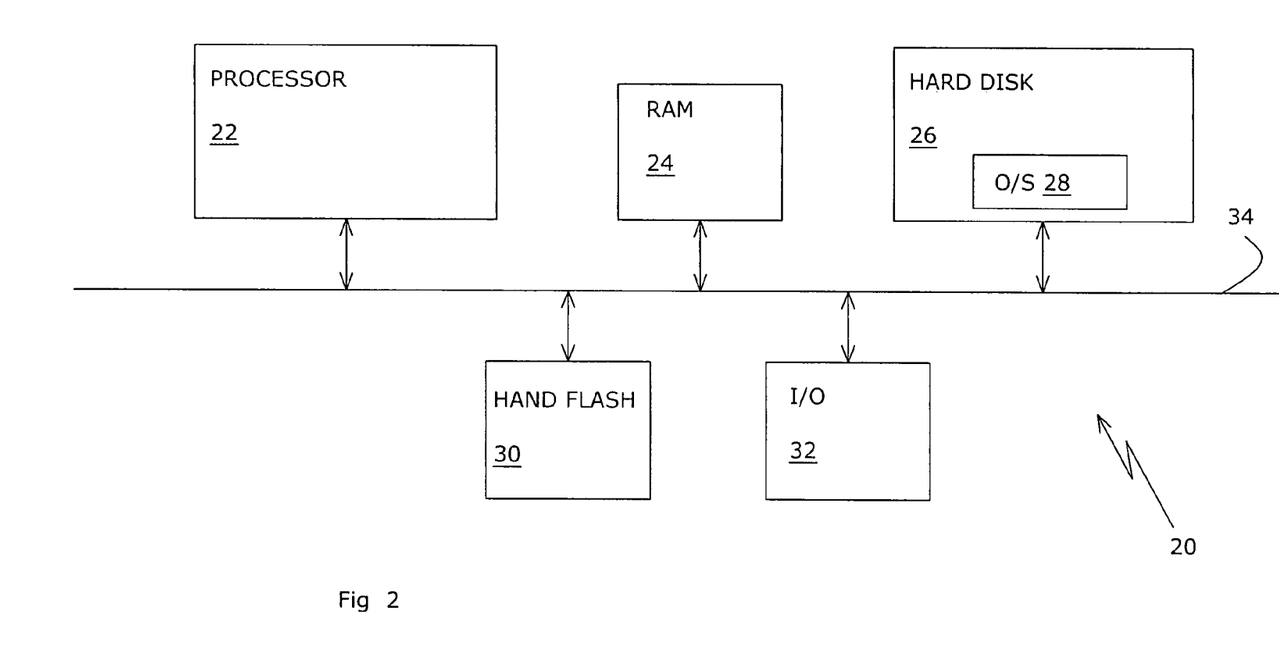
FIG. 2 is a high-level block diagram of a computer system of the present invention.

Device 10 is an example of a firmware implementation of the method of the present invention. FIG. 2 is a partial high-level block diagram of a computer system 20 of the present invention that is an example of a software implementation of the method of the present invention. System 20 includes a processor 22; a RAM 24; input and output devices such as a keyboard and a display screen, represented collectively by I/O block 32; and two non-volatile mass storage memories: a hard disk 26 and an MLC NAND flash memory 30. Components 22, 24, 26, 30 and 32 communicate with each other via a common bus 34. Among the data stored on hard disk 26 is the code of an operating system 28. When system 20 is powered up, processor 22 downloads the code of operating system 28 to RAM 24 and then executes the code of operating system 28 from RAM 24 to manage the operation of system 20. Hard disk 26 thus is an example of a computer-readable storage medium in which is embedded computer-readable code for implementing the method of the present invention.

The code of operating system 28 includes code for managing NAND flash memory 30 as taught in U.S. Pat. No. 5,404,485 and in U.S. Pat. No. 5,937,425. The code of operating system 28 also includes code for managing NAND flash memory 30 according to the principles of the present invention. When an application being executed by processor 22 requires storage of user data sectors in NAND flash memory 30, processor 22 executes the appropriate code of operating system 28 to write the sectors in NAND flash memory 30 in the order in which these sectors are generated by the application and/or not necessarily in the optimal mode for NAND flash memory 30. Later, processor 22 executes the appropriate code of operating system 28 to copy the sectors within NAND flash memory 30 in the optimal order and/or according to the optimal writing mode of NAND flash memory 30. Under the second method of the present invention, as part of the second set of write operations, processor 22 reads data sectors that are to be rewritten in NAND flash memory 30 from NAND flash memory 30, stores these sectors temporarily in RAM 24 and writes the sectors twice from RAM 24 to NAND flash memory 30.

While the invention has been described with respect to a limited number of embodiments, it will be appreciated that many variations, modifications and other applications of the invention may be made.

What is claimed is:

1. A method of storing a plurality of sectors of data, comprising the steps of:
   (a) providing a non-volatile memory;
   (b) writing all the sectors in said non-volatile memory in a first order; and
   (c) subsequent to said writing of all the sectors in said first order, writing all the sectors in said non-volatile memory in a second order, different from said first order, that is determined prior to said writing of the sectors in said second order.

2. The method of claim 1, wherein said first and second orders are temporal orders.

3. The method of claim 1, wherein said second order is determined in accordance with the data.

4. The method of claim 1, wherein said non-volatile memory is provided as part of a memory device that includes at least one other memory, and wherein, between said writing of all the sectors in said non-volatile memory in said first order and said writing of all the sectors in said non-volatile memory in said second order, the sectors are stored in said memory device only in said non-volatile memory.

5. The method of claim 1, wherein said writing in said second order is effected using a different writing mode than said writing in said first order.

6. The method of claim 5, wherein said mode of said writing in said first order has a different density than said mode of said writing in said second order.

7. The method of claim 6, wherein said non-volatile memory includes a plurality of cells, and wherein said mode of said writing in said first order stores a different number of bits of the data per cell than said mode of said writing in said second order.

8. The method of claim 7, wherein said mode of said writing in said first order stores fewer said bits per cell than said mode of said writing in said second order.

9. The method of claim 6, wherein said mode of said writing in said first order has a lower density than said mode of said writing in said second order.

10. The method of claim 9, wherein said mode of said writing in said first order reduces coupling between cells of said non-volatile memory that are written thereby, relative to said coupling between said cells of said non-volatile memory that are written by said mode of said writing in said second order, by leaving unwritten cells between cells that are written.

11. The method of claim 10, wherein said unwritten cells include cells of pages of said non-volatile memory that are skipped by said mode of said writing in said first order.

12. The method of claim 11, wherein every pair of said pages that are written by said mode of said writing in said first order have between them at least one unwritten page.

13. The method of claim 11, wherein every pair of said pages that are written by said mode of said writing in said first order have between them at least three unwritten pages.

14. The method of claim 5, wherein said writing in said first order has a different reliability than said writing in said second order.

15. The method of claim 14, wherein said writing in said first order has a lower reliability than said writing in said second order.

16. The method of claim 15, wherein said different reliability includes a different data retention time.

17. The method of claim 1, wherein said writing in said second order is effected by a single plurality of consecutive write operations.

18. The method of claim 1, wherein said writing in said second order is effected by a plurality of intermittent write operations.

19. The method of claim 1, wherein, during said writing of the sectors in said second order, at least one sector is written twice in said non-volatile memory.

20. A method of storing a plurality of sectors of data, comprising the steps of:
   (a) providing a non-volatile memory;
   (b) writing the sectors in said memory using a first set of at least one write operation, each said sector being written only once by said first set; and (c) subsequent to beginning said writing of the sectors using said first set, writing the sectors in said memory from outside said non-volatile memory using a second set of at least one write operation, at least one of the sectors being written twice by said second set.

21. The method of claim 20, wherein said second set uses a different writing mode than said first set.

22. The method of claim 21, wherein said mode of said first set has a different density than said mode of said second set.

23. The method of claim 22, wherein said memory includes a plurality of cells, and wherein said mode of said first set stores a different number of bits of the data per cell than said mode of said first set.

24. The method of claim 23, wherein said mode of said first set stores fewer said bits per cell than said mode of said second set.

25. The method of claim 22, wherein said mode of said first set has a lower density than said mode of said second set.

26. The method of claim 21, wherein said writing mode of said first set has a different reliability than said writing mode of said second set.

27. The method of claim 26, wherein said writing mode of said first set has a lower reliability than said writing mode of said second set.

28. The method of claim 20, wherein said second set includes a consecutive plurality of write operations.

29. The method of claim 20, wherein said second set includes an intermittent plurality of write operations.

30. The method of claim 20, wherein said non-volatile memory is provided as part of a memory device that includes at least one other memory, and wherein, between said writing of the sectors in said non-volatile memory by said first set and said writing of the sectors in said non-volatile memory by said second set, the sectors are stored in said memory device only in said non-volatile memory.

31. The method of claim 20, wherein said non-volatile memory includes a plurality of cells, and wherein said writing by said first set uses a writing mode that has less coupling between said cells that then are written than said writing by said second set.

32. A method of storing a plurality of sectors of data, comprising the steps of:
    (a) providing a non-volatile memory that includes a plurality of cells;
    (b) writing the sectors in said non-volatile memory using a first set of at least one write operation; and
    (c) subsequent to beginning said writing of the sectors using said first set, writing the sectors in said non-volatile memory using a second set of at least one write operation, at least one of the sectors being written twice by said second set;
wherein said writing by said first set uses a first writing mode and said writing by said second set uses a second writing mode, said first writing mode reducing coupling between said cells that are written thereby, relative to said coupling between said cells that are written by said second writing mode, by leaving unwritten cells between cells that are written.

33. The method of claim 32, wherein said unwritten cells include cells of pages of said non-volatile memory that are skipped by said first writing mode.

34. The method of claim 33, wherein every pair of said pages that are written by said first writing mode have between them at least one unwritten page.

35. The method of claim 33, wherein every pair of said pages that are written by said first writing mode have between them at least three unwritten pages.

36. The method of claim 32, wherein said non-volatile memory is provided as part of a memory device that includes at least one other memory, and wherein, between said writing of the sectors in said non-volatile memory by said first set and said writing of the sectors in said non-volatile memory by said second set, the sectors are stored in said memory device only in said non-volatile memory.

37. The method of claim 32, wherein said second set includes a consecutive plurality of write operations.

38. The method of claim 32, wherein said second set includes an intermittent plurality of write operations.

39. A method of storing a plurality of sectors of data, comprising the steps of:
    (a) providing a non-volatile memory;
    (b) writing the sectors in said non-volatile memory using a first set of at least one write operation; and
    (c) subsequent to beginning said writing of the sectors using said first set, writing the sectors in said non-volatile memory using a second set of at least one write operation, at least one of the sectors being written twice by said second set;
wherein said writing by said first set has a lower reliability than said writing by said second set.

40. The method of claim 39, wherein said non-volatile memory is provided as part of a memory device that includes at least one other memory, and wherein, between said writing of the sectors in said non-volatile memory by said first set and said writing of the sectors in said non-volatile memory by said second set, the sectors are stored in said memory device only in said non-volatile memory.

41. The method of claim 39, wherein said lower reliability includes a lower data retention time.

42. The method of claim 39, wherein said second set includes a consecutive plurality of write operations.

43. The method of claim 39, wherein said second set includes an intermittent plurality of write operations.

44. A memory device for storing a plurality of sectors of data, comprising:
    (a) a non-volatile memory; and
    (b) a controller for:
        (i) writing the sectors in said non-volatile memory in a first order, and
        (ii) subsequent to said writing of the sectors in said first order, writing the sectors in said non-volatile memory in a second order, different from said first order, that is determined prior to said writing of the sectors in said second order.

45. A memory device for storing a plurality of sectors of data, comprising:
    (a) a non-volatile memory; and
    (b) a controller for:
        (i) writing the sectors in said non-volatile memory using a first set of at least one write operation, each said sector being written only once by said first set, and
        (ii) subsequent to beginning said writing of the sectors using said first set, writing the sectors in said non-volatile memory using a second set of at least one write operation from outside said non-volatile memory, at least one of the sectors being written twice by said second set.

46. A memory device for storing a plurality of sectors of data, comprising:

(a) a non-volatile memory that includes a plurality of cells; and
(b) a controller for:
  (i) writing the sectors in said non-volatile memory using a first set of at least one write operation, and
  (ii) subsequent to beginning said writing of the sectors using said first set, writing the sectors in said non-volatile memory using a second set of at least one write operation, at least one of the sectors being written twice by said second set,
wherein said writing by said first set uses a first writing mode and said writing by said second set uses a second writing mode, said first writing mode reducing coupling between said cells that are written thereby, relative to said coupling between said cells that are written by said second writing mode, by leaving unwritten cells between cells that are written.

47. A memory device for storing a plurality of sectors of data, comprising:
(a) a non-volatile memory; and
(b) a controller for:
  (i) writing the sectors in said non-volatile memory using a first set of at least one write operation, and
  (ii) subsequent to beginning said writing of the sectors using said first set, writing the sectors in said non-volatile memory using a second set of at least one write operation, at least one of the sectors being written twice by said second set,
wherein said writing by said first set has a lower reliability than said writing by said second set.

48. A computer-readable storage medium having computer-readable code embedded on the computer-readable storage medium, the computer-readable code for storing a plurality of sectors of data, the computer-readable code comprising:
(a) program code for writing the sectors in a non-volatile memory in a first order; and
(b) program code for, subsequent to said writing of the sectors in said first order, writing the sectors in said non-volatile memory in a second order, different from said first order, that is determined prior to said writing of the sectors in said second order.

49. A computer-readable storage medium having computer-readable code embedded on the computer-readable storage medium, the computer-readable code for storing a plurality of sectors of data, the computer-readable code comprising:
(a) program code for writing the sectors in a non-volatile memory using a first set of at least one write operation, each said sector being written only once by said first set; and
(b) program code for writing the sectors in said memory from outside said non-volatile memory using a second set of at least one write operation, at least one of the sectors being written twice by said second set.

50. A computer-readable storage medium having computer-readable code embedded on the computer-readable storage medium, the computer-readable code for storing a plurality of sectors of data, the computer-readable code comprising:
(a) program code for writing the sectors in a non-volatile memory using a first set of at least one write operation; and
(b) program code for writing the sectors in said non-volatile memory using a second set of at least one write operation, at least one of the sectors being written twice by said second set;
wherein said non-volatile memory includes a plurality of cells, wherein said writing by said first set uses a first writing mode and wherein said writing by said second set uses a second writing mode, said first writing mode reducing coupling between said cells that are written thereby, relative to said coupling between said cells that are written by said second writing mode, by leaving unwritten cells between cells that are written.

51. A computer-readable storage medium having computer-readable code embedded on the computer-readable storage medium, the computer-readable code for storing a plurality of sectors of data, the computer-readable code comprising:
(a) program code for writing the sectors in a non-volatile memory using a first set of at least one write operation; and
(b) program code for writing the sectors in said non-volatile memory using a second set of at least one write operation, at least one of the sectors being written twice by said second set;
wherein said writing by said first set has a lower reliability than said writing by said second set.

* * * * *